(12) United States Patent
Madison

(10) Patent No.: US 8,921,757 B2
(45) Date of Patent: Dec. 30, 2014

(54) ANTI-BLOOMING CIRCUIT FOR INTEGRATING PHOTODIODE PRE-AMPLIFIERS

(71) Applicant: BAE SYSTEMS Information & Electronic Systems Integration Inc., Nashua, NH (US)

(72) Inventor: Gary M Madison, Waltham, MA (US)

(73) Assignee: BAE SYSTEMS Information and Electronic Systems Integration Inc., Nashua, NH (US)

( * ) Notice: Subject to any disclaimer, the term of this patent is extended or adjusted under 35 U.S.C. 154(b) by 148 days.

(21) Appl. No.: 13/804,994

(22) Filed: Mar. 14, 2013

(65) Prior Publication Data

US 2013/0284902 A1    Oct. 31, 2013

Related U.S. Application Data

(60) Provisional application No. 61/638,221, filed on Apr. 25, 2012.

(51) Int. Cl.
H03F 3/08    (2006.01)
(52) U.S. Cl.
CPC .................................... *H03F 3/082* (2013.01)
USPC ................................................... 250/214 A

(58) Field of Classification Search
USPC ................... 250/214 A, 214 R, 214.1, 208.1;
348/307–308; 257/290–292
See application file for complete search history.

(56) References Cited

U.S. PATENT DOCUMENTS

| 7,573,016 B2 * | 8/2009 | Koyama ..................... 250/214 A |
| 7,705,899 B2 * | 4/2010 | Koyama et al. ............... 348/301 |
| 7,940,122 B2 * | 5/2011 | Satou ........................... 330/282 |

* cited by examiner

*Primary Examiner* — Seung C Sohn
(74) *Attorney, Agent, or Firm* — Maine Cernota & Rardin; Douglas P. Burum; Daniel J. Long

(57) ABSTRACT

An input clamping circuit of a photo detector preamplifier is activated when an input transistor is turned off by an input overload, and the drain voltage of the input transistor is pulled toward ground by a current source. Even with extreme overloads, the operating conditions (Vgs and Id) of the input transistor remain within normal range. During normal operation, the clamping circuit is biased completely off, and has essentially no effect on circuit performance. Since the input FET itself, rather than a separate device, detects the onset of an overload, significantly improved clamping performance is realized without adding additional circuit complexity. The input transistor can be a FET. The preamplifier can be a cascode preamplifier. The clamping circuit can include a clamping FET or other clamping transistor gated by the input transistor drain. In embodiments, the clamping circuit increases current requirements of the preamplifier by no more than 25%.

10 Claims, 3 Drawing Sheets

ANTI-BLOOMING CIRCUIT FOR INTEGRATING PHOTODIODE PRE-AMPLIFIERS

RELATED APPLICATIONS

This application claims the benefit of U.S. Provisional Application No. 61/638,221, filed Apr. 25, 2012, which is herein incorporated by reference in its entirety for all purposes.

STATEMENT OF GOVERNMENT INTEREST

This invention was made with United States Government support under Contract No. FA9453-07-C-0181 awarded by U.S. Department of the Air Force. The United States Government has certain rights in this invention.

FIELD OF THE INVENTION

The invention relates to optical sensing apparatus, and more particularly, to circuitry that minimizes the effect of a very large optical input on an optical sensing apparatus.

BACKGROUND OF THE INVENTION

Arrays of photo-sensors, typically arrays of photo diodes, are well known and in wide use for many applications, such as the capture of images by digital cameras and digital video recorders. When an image is focused by a lens onto such an array, it is often referred to as a Focal Planar Array, or "FPA." The term "FPA" is used herein to refer generically to any array of photo sensors, unless otherwise required by the context.

FPA's take on many configurations, according to constraints such as cost, bandwidth of light to be sensed/imaged, required image capture speed, resolution requirements, and required sensitivity. Typically, each photo-sensor or "pixel" in an FPA provides output to a preamplifier of some kind. For applications where image capture speed is not critical and maximum sensitivity is needed, an integrating preamplifier is often used. An integrating preamplifier includes a capacitor that accumulates charge during a sampling period, so that the preamplifier provides an output having a signal-to-noise ratio that is improved according to the square root of the sampling period. An integrating preamplifier also includes a reset that is configured to discharge the capacitor and begin a new measurement at the end of each sampling period.

For some applications, an FPA may be susceptible to very large optical exposures that can at least temporarily blind photo-sensors and/or the optical apparatus as a whole. When a photo-sensor is exposed to an excess of light, it is unavoidable that it will be saturated and temporarily blinded. Once the excess light is removed, a "recovery time" will be needed before the photo-sensor can provide an undistorted output. While the recovery time is not necessarily a linear function of the saturating light intensity, it is generally true that the recovery time of the preamplifier will be longer for stronger saturating light intensities.

In cases where only one or only some of the photo-sensors in an array are subject to a saturating light exposure, it can sometimes happen that surrounding photo-sensors that are not directly exposed to the saturating light will nevertheless be saturated. The apparent result in an image is a spreading out of a white "blind spot" from the affected pixel(s) to surrounding pixels. This effect is often referred to as "blooming." This problem can be especially problematic when the preamplifiers are integrating preamplifiers.

A circuit for a typical prior art integrating preamplifier is shown in FIG. 1. The preamplifier is basically a cascode amplifier, including an input FET 102 and a cascode FET 104. The drain of the cascode FET is fed by a current source FET 106. The input of the preamplifier 100 is current from a photodiode. Also, through the feedback action of the preamplifier, an equal and opposite current is fed to the preamplifier input 100 through capacitor 108 so as to hold the amplifier input voltage constant. For this reason, the input 100 is sometimes referred to as a "summing junction." The effect of this current is to charge capacitor 108, causing the output 110 of the preamplifier to represent a result that is summed or "integrated" over some sampling period. When the sampling period is ended, the capacitor is discharged by a reset FET 112, and a new sampling period begins.

At least one set of circumstances that can lead to blooming in an apparatus such as FIG. 1 is as follows. Excessive irradiation of the photodiode can cause a high current from the photodiode output, which is the preamplifier input 100, causing the preamplifier input voltage to rise. If this voltage rises high enough, it can cause the photodiode to become forward biased, so that the diode begins to freely conduct current in a manner similar to a conventional forward-biased diode. Since the voltage supply for the photodiode is designed to support the normally small diode photocurrent, this sudden jump in current can exceed the voltage supply's current capacity, thereby causing the supply's output voltage to change.

Typically, many or all of the photo-sensors in an array will be supported by a single biasing voltage supply. Hence, if a saturated photo-sensor in the array becomes forward-biased and causes the biasing voltage supply to change, this will affect not only the saturated photo-sensor, but also all of the other photo-sensors that are supported by that same biasing supply, causing a saturated "white spot" in a resulting image to "bloom" outward from the saturated pixels to other, surrounding pixels that are not directly saturated. As a result, a significant portion of the image can be lost.

Of course, the preamplifiers associated with any such "bloomed" pixels will also require a recovery time after the saturating light is removed, before they can once again provide undistorted output.

With reference to FIG. 2, one approach to reducing recovery time and limiting or preventing blooming is to connect a separate clamping transistor 200 to the photodiode output 100, and to bias the clamping transistor 200 with an anti-blooming reference voltage 202 that is adjusted such that the clamping transistor 200 begins to conduct when the summing junction voltage rises above some set level. The other side of the clamping transistor 200 can be connected to the amplifier output, or to ground as shown in the figure.

This approach is basically a "brute force" method for limiting the maximum photodiode output voltage, which attempts to directly limit or clip the extent of unwanted photodiode output voltage rise. Unfortunately, adding circuitry to limit the photodiode output voltage rise to as small a value as possible, while not appreciably affecting preamplifier speed or noise performance, and by using as simple a circuit as possible, are inherently conflicting requirements that necessarily entail a performance compromise. For a simple circuit such as is illustrated in FIG. 2, the clamping transistor 200 will not immediately switch to full conduction when the threshold input voltage is reached. Instead, it will typically increase its conductance over some range of input voltages, and may never fully clamp the photodiode output voltage. The on/off behavior of the clamping circuit can be improved by increasing its complexity. However, this can lead to added cost, added power consumption, and added space requirements.

The photodiode output voltage under normal (non-overload) operating conditions varies by only a few tens of millivolts. For a circuit such as FIG. 2, setting the anti-blooming threshold high enough to avoid compromising preamplifier performance generally permits a photodiode output voltage rise in the hundreds of millivolts before substantial clipping takes place. While this may prevent blooming with moderate overloads, the voltage increase is likely large enough to cause significant integrating amplifier operating point changes, with a possible long recovery time following the removal of the overload. For more severe overloads, the clamping ability of this circuit can easily be exceeded.

Thus the degree of overload and anti-blooming protection afforded by prior art clamping circuits such as the one shown in FIG. 2 is, at best, limited and uncertain. In effect, this approach does not prevent preamplifier overload, but functions only as an overload damage-control circuit that attempts to limit the propagation of deleterious overload effects to other photo-sensor circuits, and which in some cases is largely ineffective.

Another approach to limiting the input voltage for an overloaded integrating preamplifier is to switch the amplifier into reset, so as to restrain the rise in photodiode output voltage. However, this approach may require the preamplifier output drive capability to exceed the maximum overload current delivered to the preamplifier input, a condition that the preamplifier may not be able to meet, at least not without an increase in preamplifier complexity.

What is needed, therefore, is an apparatus that can sharply clamp the input to a photo-sensor preamplifier when the input only minimally exceeds the normal operating range of the photo-sensor, thereby minimizing the recovery time of the preamplifier and eliminating blooming caused by overloading of current supplies.

SUMMARY OF THE INVENTION

The present invention is a preamplifier input clamping circuit that maximizes performance while minimizing complexity, space, and cost. A clamping transistor, typically a clamping FET, is gated by the drain voltage of the input stage of the preamplifier, which is typically an input FET. The invention capitalizes on the fact that the initial effect of an input overload on a photo-sensor preamplifier is that its input transistor is turned off, and its drain voltage will thereby go toward ground. Accordingly, the clamping transistor is activated automatically and immediately when the input transistor begins to turn off. It is not necessary to provide or to adjust a separate anti-blooming reference voltage. The clamping behavior is sharp and substantially complete, since the clamping transistor is driven directly by the input transistor, and not by a static reference voltage.

In essence, the input transistor functions as part of the clamping circuit, so that significantly improved clamping performance is realized without adding additional circuit complexity.

In embodiments, the gate of the clamping transistor is fed by an anti-blooming current source transistor, typically a FET, whose gate is fed by the same current source control voltage that feeds the gate of the amplifier current source transistor.

Note that the term "transistor" is used herein to generically refer to a FET, a conventional transistor, or any other device having electrical performance characteristics similar to a FET, unless required otherwise by context.

One general aspect of the present invention is a preamplifier for generating a preamplifier output voltage proportional to current derived from an optical sensor, the preamplifier including an input voltage clamp that prevents an input voltage from exceeding an input voltage limit. The preamplifier includes a preamplifier input, the preamplifier input being configured to receive an input current from the optical sensor, an input transistor configured to generate a drain output voltage proportional to the input current, where the drain output voltage drops rapidly when the input voltage or current exceeds a maximum operating input voltage or current, and a clamping transistor configured to limit the input voltage, the clamping transistor being gated by the drain output voltage of the input transistor, so that when the input transistor drain output voltage is at a normal operating level the clamping transistor is turned off, but if the input voltage or current surpasses the maximum operating input voltage or current, and the input transistor drain output voltage drops, the clamping transistor is turned on and conducts sufficient current from the preamplifier input to ground to inhibit the input voltage from rising above the input voltage limit.

In embodiments, the preamplifier is an integrating preamplifier. In some embodiments the input transistor is an input FET. In various embodiments the clamping transistor is a clamping FET.

In certain embodiments the preamplifier further includes a current source transistor configured to feed a gating input of the clamping transistor. In some of these embodiments the current source transistor is a FET. In other of these embodiments the preamplifier further includes a voltage-controlled current source transistor configured to feed a drain output of the input transistor and an amplifier voltage source configured to supply voltage to both the input amplifier current source transistor and the clamping current-source transistor. In still other of these embodiments the voltage-controlled current source transistor is an FET.

In various embodiments the preamplifier is a cascode preamplifier.

Another general aspect of the present invention is an integrating cascode P-channel FET preamplifier configured for generating a preamplifier output voltage proportional to a current derived from a photodiode, the integrating preamplifier including an input voltage clamp that prevents an input voltage from exceeding an input voltage limit. The integrating preamplifier includes a preamplifier input, the preamplifier input being configured to receive from the photodiode an input current, an input FET configured to generate a drain output voltage proportional to the input current, a cascode FET having a cascode input connected to the drain output of the input FET, an integrating capacitor connected between the preamplifier input and a drain of the cascode FET, so that the integrating capacitor tends to maintain a constant preamplifier input voltage by delivering a current equal to and opposite from the input current, thereby becoming charged to a voltage proportional to the input current, a reset circuit configured to discharge the integrating capacitor after a sampling period, an N-channel current source configured to pull the input FET drain voltage low when the input voltage or current exceeds a maximum operating input voltage or current and the input FET is thereby turned off, and a P-channel source-follower FET having a source connected to the preamplifier input, a drain connected to ground, and a gate connected to the drain output of the input FET, the source-follower FET being configured to be turned off when the input FET drain output voltage is at a normal operating level, and to be turned on if the input voltage or current surpasses the maximum operating input voltage or current, and the input FET drain output voltage drops, so that sufficient current is shunted from the preamplifier input to ground to inhibit the preamplifier input voltage from rising above the input voltage limit.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
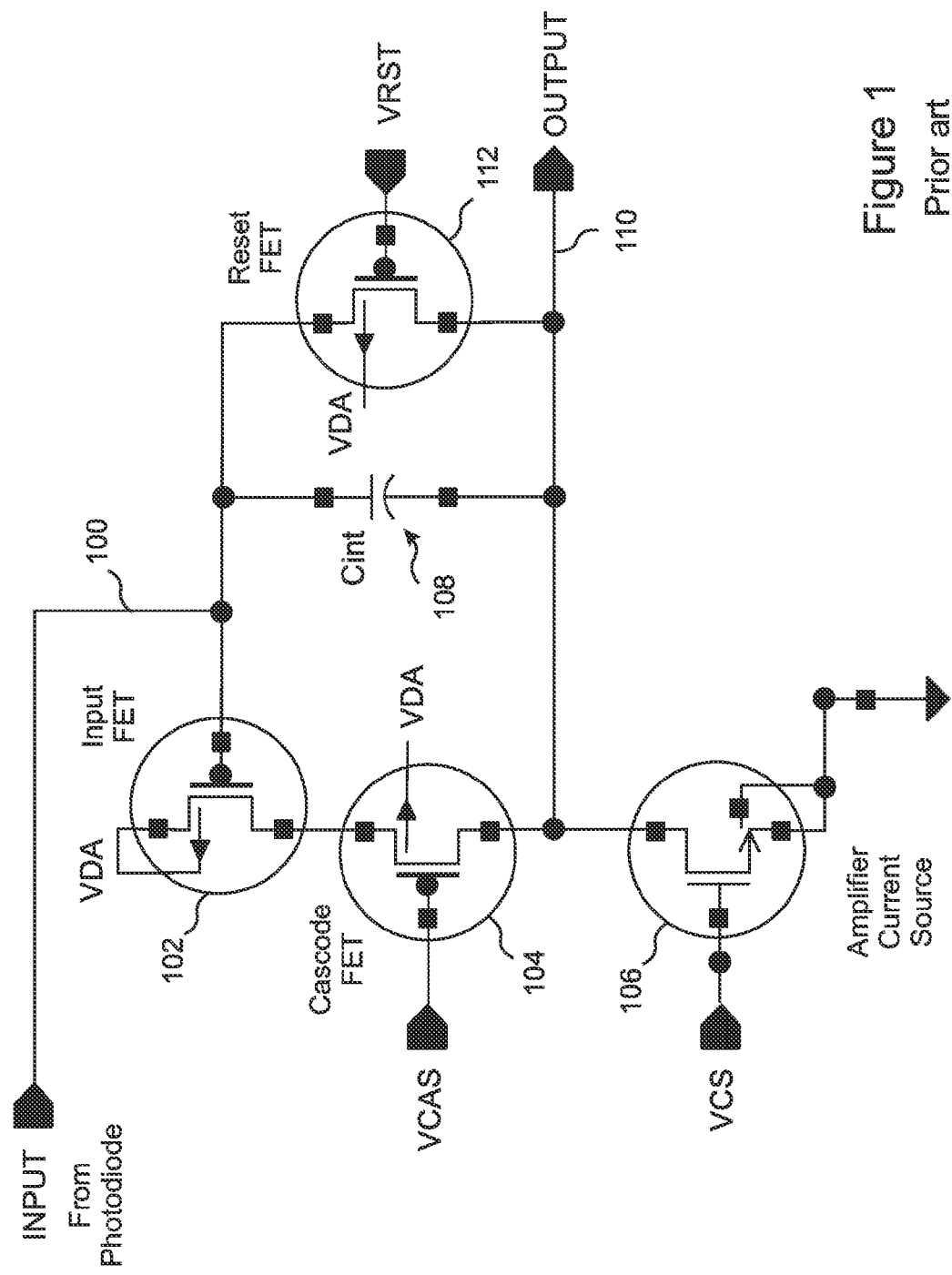
FIG. 1 is a circuit diagram of a typical prior art optical sensor integrating preamplifier.
Figure 2:
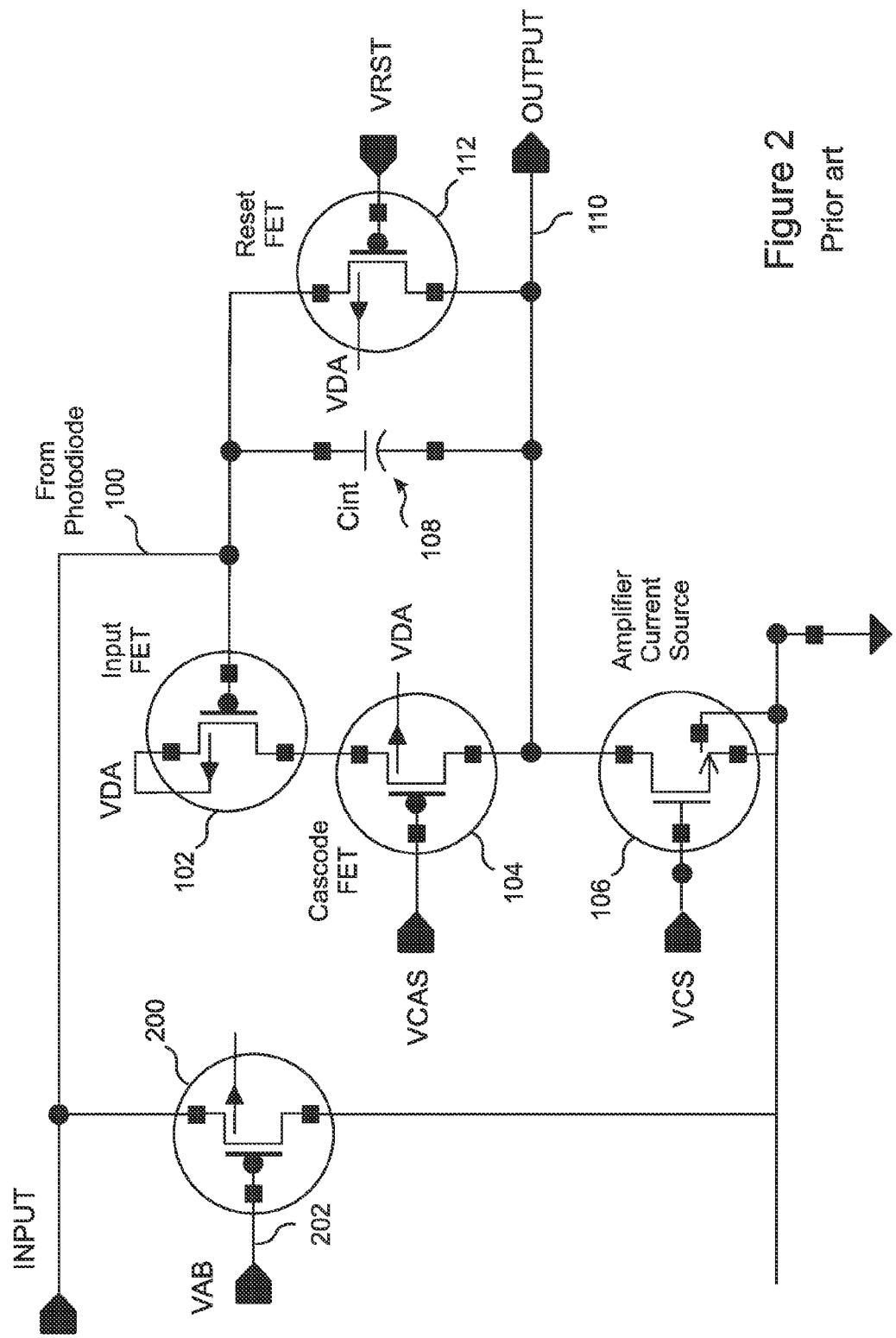
FIG. 2 is a circuit diagram similar to FIG. 1, but including a typical prior-art input clamping circuit.
Figure 3:
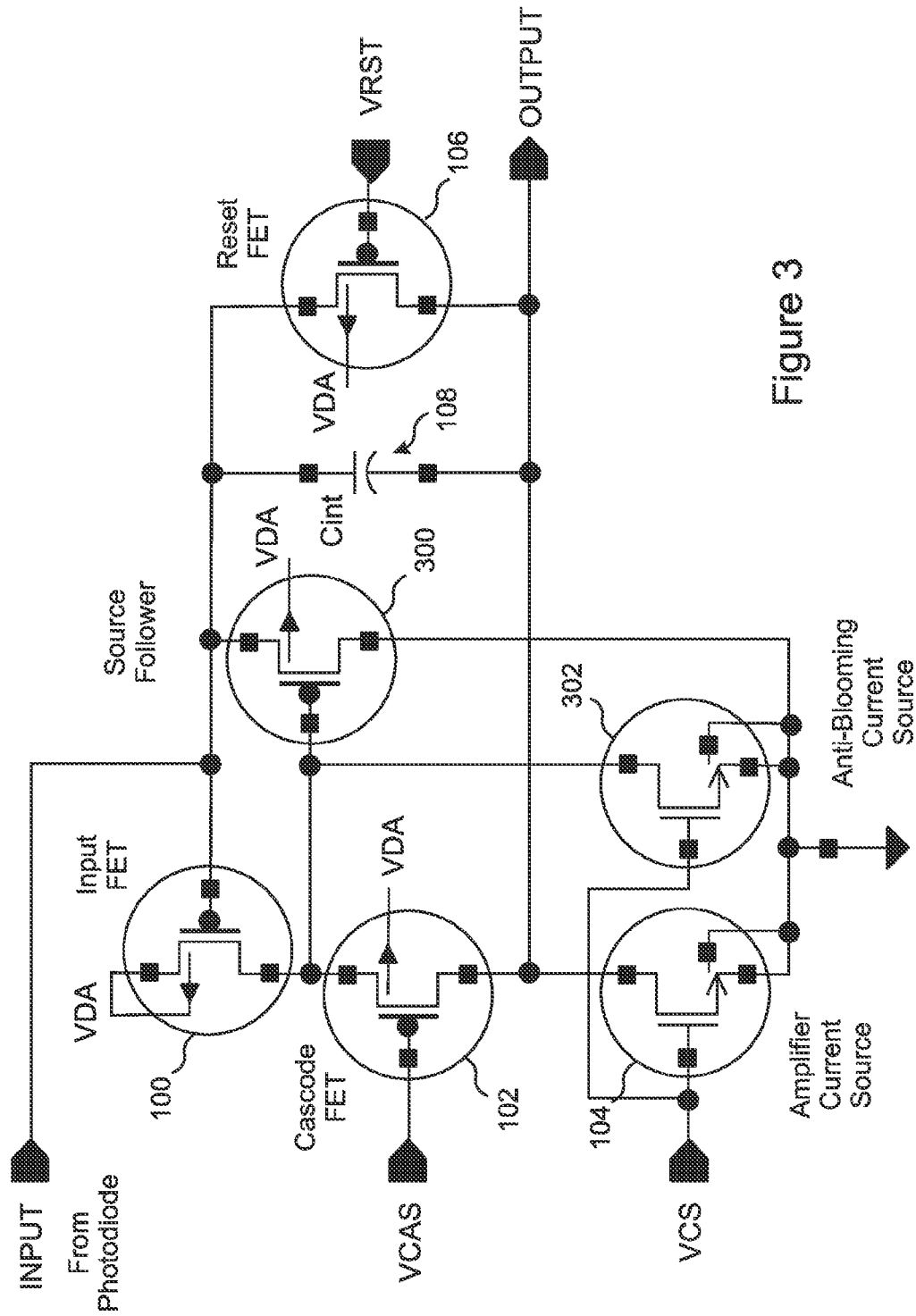
FIG. 3 is a circuit diagram of an embodiment of the present invention.

The present invention is a preamplifier input clamping circuit that maximizes performance while minimizing complexity, space, and cost. An embodiment of the invention is illustrated in FIG. 3. A clamping transistor 300, typically a clamping FET 300, is gated by the drain voltage of the input transistor 100 of the preamplifier, which is typically an input FET 100. The invention capitalizes on the fact that the initial effect of an input overload on a photo-sensor preamplifier is that its input transistor 100 is turned off, and its drain voltage will thereby go toward ground. Accordingly, the clamping transistor 300 is activated automatically and immediately when the input transistor 100 begins to turn off. It is not necessary to provide or to adjust a separate anti-blooming reference voltage 202.

The clamping behavior is sharp and substantially complete, since the clamping transistor 300 is driven by the input transistor 100, and not by a static reference voltage 202.

Since the amplifier input transistor 100 itself, rather than a separate device, detects the onset of overload, which happens before there is any significant rise in the input voltage, significantly improved clamping performance is realized without adding additional circuit complexity.

In embodiments, the gate of the clamping transistor 300 is fed by an anti-blooming current source transistor 302, typically a FET 302, whose gate is fed by the same current source control voltage that feeds the gate of the amplifier current source transistor 104. The anti-blooming transistor thereby pulls the drain of the input transistor 100 and the gate of the clamping transistor 300 toward ground when the input transistor 100 is turned off.

Note that the speed of response of the present invention to an overload is not limited by the charge of the integration capacitor charge 108, nor by its discharge times or its charging status at the time of overload. Even with extreme overloads, so long as the on-resistance limit of the clamping resistor 300 is not reached, the operating conditions (Vgs and Id) of the input transistor 100 will remain within their normal range.

During normal (non-overload) operation, the clamping transistor 300 is biased completely off, and is thus effectively out of the circuit, thereby minimizing any impact of the clamping transistor 300 on sensitivity or performance of the preamplifier. In embodiments, the additional current drawn by the clamping transistor 300 and anti-blooming transistor 302 only increases nominal preamplifier operating current by a small amount, typically not more than 25%.

Note that the term "transistor" is used herein to generically refer to a FET, a conventional transistor, or any other device having electrical performance characteristics similar to a FET, unless required otherwise by context.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A preamplifier for generating a preamplifier output voltage proportional to current derived from an optical sensor, the preamplifier including an input voltage clamp that prevents an input voltage from exceeding an input voltage limit, the preamplifier comprising:
  a preamplifier input, the preamplifier input being configured to receive an input current from the optical sensor;
  an input transistor configured to generate a drain output voltage proportional to the input current, where the drain output voltage drops rapidly when the input voltage or current exceeds a maximum operating input voltage or current; and
  a clamping transistor configured to limit the input voltage, the clamping transistor being gated by the drain output voltage of the input transistor, so that when the input transistor drain output voltage is at a normal operating level the clamping transistor is turned off, but if the input voltage or current surpasses the maximum operating input voltage or current, and the input transistor drain output voltage drops, the clamping transistor is turned on and conducts sufficient current from the preamplifier input to ground to inhibit the input voltage from rising above the input voltage limit.

2. The preamplifier of claim 1 wherein the preamplifier is an integrating preamplifier.

3. The preamplifier of claim 1, wherein the input transistor is an input FET.

4. The preamplifier of claim 1, wherein the clamping transistor is a clamping FET.

5. The preamplifier of claim 1, further comprising a current source transistor configured to feed a gating input of the clamping transistor.

6. The preamplifier of claim 5, wherein the current source transistor is a FET.

7. The preamplifier of claim 5, further comprising:
  a voltage-controlled current source transistor configured to feed a drain output of the input transistor; and
  an amplifier voltage source configured to supply voltage to both the input amplifier current source transistor and the clamping current-source transistor.

8. The preamplifier of claim 5, wherein the voltage-controlled current source transistor is an FET.

9. The preamplifier of claim 1, wherein the preamplifier is a cascode preamplifier.

10. An integrating cascode P-channel FET preamplifier configured for generating a preamplifier output voltage proportional to a current derived from a photodiode, the integrating preamplifier including an input voltage clamp that prevents an input voltage from exceeding an input voltage limit, the integrating preamplifier comprising:

a preamplifier input, the preamplifier input being configured to receive from the photodiode an input current;

an input FET configured to generate a drain output voltage proportional to the input current;

a cascode FET having a cascode input connected to the drain output of the input FET;

an integrating capacitor connected between the preamplifier input and a drain of the cascode FET, so that the integrating capacitor tends to maintain a constant preamplifier input voltage by delivering a current equal to and opposite from the input current, thereby becoming charged to a voltage proportional to the input current;

a reset circuit configured to discharge the integrating capacitor after a sampling period;

an N-channel current source configured to pull the input FET drain voltage low when the input voltage or current exceeds a maximum operating input voltage or current and the input FET is thereby turned off; and a P-channel source-follower FET having a source connected to the preamplifier input, a drain connected to ground, and a gate connected to the drain output of the input FET, the source-follower FET being configured to be turned off when the input FET drain output voltage is at a normal operating level, and to be turned on if the input voltage or current surpasses the maximum operating input voltage or current, and the input FET drain output voltage drops, so that sufficient current is shunted from the preamplifier input to ground to inhibit the preamplifier input voltage from rising above the input voltage limit.

* * * * *